United States Patent [15] 3,646,450

Ma [45] Feb. 29, 1972

[54] VOLTAGE-CONTROLLED PLURAL-BAND TUNER FOR A WAVE SIGNAL RECEIVER

[72] Inventor: John Y. Ma, Algonquin, Ill.

[73] Assignee: Zenith Radio Corporation, Chicago, Ill.

[22] Filed: Aug. 13, 1969

[21] Appl. No.: 849,837

[52] U.S. Cl. .......... 325/458, 325/465
[51] Int. Cl. .......... H04b 1/16
[58] Field of Search .......... 325/452, 458, 459, 461, 462, 325/464, 465, 468; 334/14, 15, 16

[56] References Cited

UNITED STATES PATENTS 3,559,075 1/1971 Okazaki .......... 325/459

*Primary Examiner*—Richard Murray
*Attorney*—John J. Pederson and Donald B. Southard

[57] ABSTRACT

Selective tuning to any broadcast channel within a plurality of frequency bands is achieved by voltage-controlled tunable circuitry, such as the type employing varactor or varicap diodes, responsive to an adjustable DC tuning voltage, having unique levels assigned to the various desired channels. The voltage level, in tuning across all of the frequency bands, must be varied over a predetermined amplitude range, portions of which range are effectively assigned to different respective ones of the bands. Band switching of the tunable circuitry occurs automatically and electronically under control of the tuning voltage. Each time its amplitude is changed from a level in one portion of the range to a level in another portion, the tuner is made tunable over a different frequency band. No mechanical switches are needed to accomplish band switching.

7 Claims, 2 Drawing Figures

Inventor
John Y. Ma

By James E. Tracy
Attorney

VOLTAGE-CONTROLLED PLURAL-BAND TUNER FOR A WAVE SIGNAL RECEIVER

BACKGROUND OF THE INVENTION

This invention relates to a novel voltage-controlled tuning system for selectively tuning a wave signal receiver to the transmission channels of at least two of the bands of the frequency spectrum. The invention is particularly attractive when incorporated in a VHF tuner (which must cover spaced-apart and nonadjacent low VHF and high VHF bands) for a television receiver, and will be described in such an environment.

A voltage-controlled tuner includes, in each of its tunable resonant circuits, a variable reactance device that tunes the circuit to different channels in response to changes in amplitude of a DC control or tuning voltage applied to the device. Usually, each of these devices takes the form of a voltage-controlled variable capacitance diode, commonly called varactor or varicap diode, the capacitance of which is determined by the magnitude of the applied tuning voltage. As the tuner is actuated to different positions, the voltage level varies in order to change the resonant frequency of each tunable circuit to effect tuning to different channels.

When more than one frequency band is to be covered by the tuner band switching may be attained in a variety of different manners, while permitting the varicap diodes to be common to and used in each band. For example, for each band a different inductance coil may be mechanically switched into each tunable circuit. As another example, each tunable circuit may comprises a sectionalized inductance coil with different sections being shorted out by mechanical switches for reception of different bands. To avoid the translation of RF (or radio frequency) signals through the mechanical switches in the last example, electronic switching or gating devices may be used. In one such tuner switching diodes, selectively turned ON (i.e., conductive) or OFF (i.e., nonconductive) under control of an applied DC switching voltage, are connected in shunt with portions of the inductance coils of the tunable circuits. Each diode is turned ON by one magnitude-polarity condition of the switching voltage and turned OFF in response to another magnitude-polarity condition. Unfortunately, the utilization of switching diodes to accomplish band switching has not obviated the need for mechanical switches. In the past it has been necessary to employ a mechanical switching arrangement of some sort (often times of complex construction) to control the application of the switching voltage as the tuner is actuated from one band to the next.

The present invention constitutes a significant advance in the art since applicant's tuning system is capable of tuning through a plurality of frequency bands (either adjacent or nonadjacent in the spectrum) without requiring any mechanical switches whatsoever to effect band switching. The absence of such switches provides several advantages over the prior voltage-controlled plural-band tuners. To mention a few, operation of applicant's tuner is substantially simplified, manufacturing economies are realized, potential causes of trouble and malfunctioning are removed (switch contacts are susceptible to oxidation, wear, dirt accumulation, corrosion, etc.), and greater reliability is obtained.

Accordingly, it is an object of the invention to provide, for a wave signal receiver, a new and improved plural-band tuning system that is considerable easier to set up and operate than previous varicap tuners.

Another object is to provide a more reliable, but yet less expensive, plural-band varactor tuner.

It is still another object to provide a contactless band-switching arrangement for a plural-band tuner.

An additional goal is to provide a varactor tuner with automatic and electronic band switching.

A further object of the invention is to provide, for a plural-band varactor tuner, a tuning voltage having a different unique amplitude level for every channel to which the tuner may be tuned.

SUMMARY OF THE INVENTION

A tuner, for selectively tuning a wave signal receiver to any one of several broadcast channels divided into or occupying a plurality of frequency bands, constructed in accordance with one aspect of the invention comprises means for developing a tuning voltage whose amplitude is adjustable as between several discrete amplitude levels within a predetermined amplitude range. Each level within a first portion of the range is assigned to and effectively designates a different respective channel of one of the frequency bands and each level within a second portion of the range is assigned to and effectively designates a different respective channel of another one of the frequency bands. There are tunable means, including at least one voltage-controlled variable reactance device, for tuning the receiver. Band-switching means operate in response to the tuning voltage for rendering the tunable means tunable over the aforesaid one band when the voltage's amplitude is within the first portion of the range and over the other band when the voltage's amplitude is within the second portion. The tuner also includes means for applying the tuning voltage to the tunable means to effect tuning of the receiver to the particular channel designated by the voltage's amplitude level.

A plural-band tuner, constructed according to another aspect of the invention, comprises adjustable means for developing a tuning voltage having a selected amplitude level effectively designating a selected desired channel and also designating the particular frequency band in which that channel is located. Band switching means respond to the amplitude of the tuning voltage for conditioning voltage-controlled tunable means to be tunable over the frequency band containing the desired channel. The tuning voltage is applied to the tunable means to effect tuning to the desired channel.

DESCRIPTION OF THE DRAWING

The features of the invention which are believed to be novel are set forth with particularity in the appended claims. The invention, together with further objects and advantages thereof, may best be understood, however, by reference to the following description in conjunction with the accompanying drawing in which:

DESCRIPTION OF THE ILLUSTRATED EMBODIMENT

Figures 1, 2:
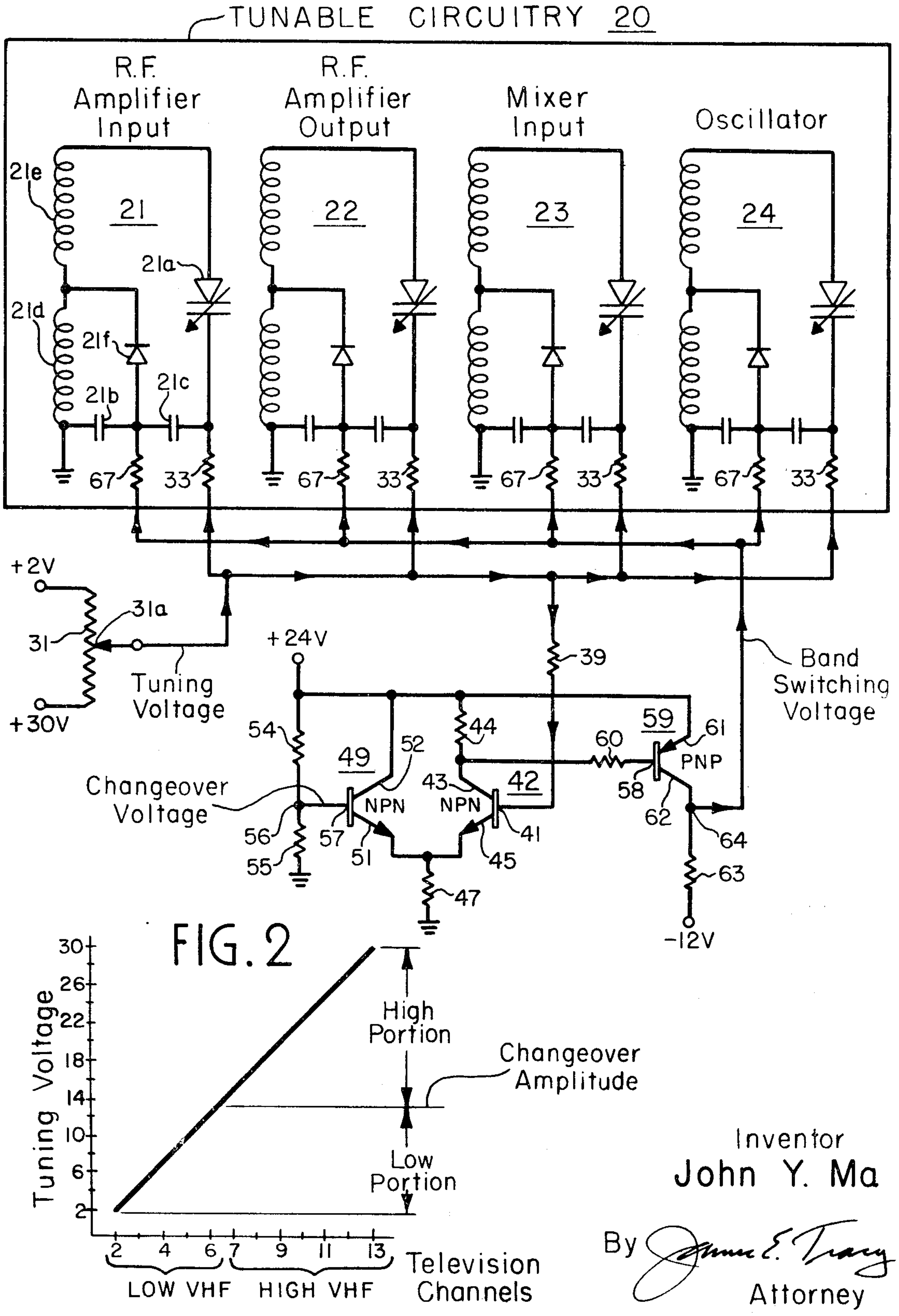
FIG. 1 is a schematic representation of a VHF television tuner embodying the invention, and in simplified and abbreviated form illustrates most clearly the manner in which the invention may be practiced; and, FIG. 2 is a graph which is helpful in explaining the operation of the tuner of FIG. 1.

While the invention is employed in a VHF television tuner, the particular frequency bands to be served by applicant's tuner are actually of no concern. The tuner may, for example, constitute a radio tuner and be designed to select any channel in the AM and/or FM bands or in any of the shortwave bands. A VHF television tuner must be capable of selecting any one of 12 VHF channels divided into two nonadjacent frequency bands. In accordance with the transmission standards existing in the United States, the first five channels (called Channels 2–6) fall within the low VHF band which extends from 54 to 88 mHz., while the remaining seven channels (Channels 7–13) occupy the high VHF band 174–216 mHz. Each channel extends over a bandwidth of 6 mHz. and the channels within each band are uniformly spaced. Television signals are also transmitted in the United States over 70 channels in the UHF band of 470–890 mHz. It will be made apparent that applicant's invention is also applicable to an all-channel television tuner which covers the UHF band as well as the low and high VHF bands and thus is capable of selecting any one of 82 channels. The invention is illustrated in conjunction with a two-band tuner merely to simplify the disclosure and to pinpoint most clearly applicant's novel concept.

Turning now to the drawing, block 20 schematically illustrates voltage-controlled tunable circuitry for selectively tuning a television receiver, in which the circuitry is included, to any channel within the two VHF frequency bands. Since its construction is somewhat conventional, only that much of circuitry 20 is shown in detail as is necessary to fully understand the operation of the invention. Tunable means 20 is of the superheterodyne type having an RF amplifier and a variable frequency local oscillator, the outputs of which are coupled to a mixer which in turn has a frequency-selective output circuit to provide an intermediate frequency (or IF) signal which constitutes the tuner's output signal. Conditioning of the tuner to select a particular desired television channel requires the adjustment or tuning of four different tunable resonant circuits, shown in detail within block 20 and respectively designated by the reference numerals 21, 22, 23 and 24. Tuned circuits 21 and 22 are included in the input and output respectively of the radiofrequency amplifier stage. Resonant circuit 23 is included in the input of the mixer to form, in conjunction with circuit 22, a double-tuned interstage coupling network from the output of the RF amplifier to the input of the mixer. Tunable circuit 24 constitutes part of the local oscillator and determines its operating frequency.

The composite television signal for a televised program includes two different RF carriers separated in the frequency spectrum by 4.5 mHz. The lower frequency carrier is modulated by the picture or video information, including the color information if the program is transmitted in color, and the higher frequency RF carrier is modulated by the sound or audio information. When properly tuned to receive a given channel, each of circuits 21, 22 and 23 will be tuned to resonate at the channel's center frequency, namely at the frequency midway between the two RF carriers of that channel. The oscillator-tuned circuit 24 is adjusted to resonate at a frequency appropriately higher than the center frequency by a fixed amount as determined by the intermediate frequency of the system. In accordance with the superheterodyne technique, the two RF carriers are converted to IF carriers in the mixer by beating or heterodyning the RF carriers with the local oscillator signal.

As shown, each of the four tunable circuits 21–24 is of similar construction; only the electrical values of the elements of circuit 24 will differ from the others. A detailed description of circuit 21 will thus apply to all four. Circuit 21 comprises a voltage-controlled variable reactance device, in the form of a varactor or variable capacitance diode **21*a*, shunt-connected via a pair of DC blocking capacitors 21*b* and 21*c* to an inductance means provided by a pair of series-connected inductance coils 21*d* and 21*e*. The junction of coil 21*d* and capacitor 21*b* is connected to a plane of reference potential such as ground. Since capacitors 21*b* and 21*c* are provided merely for DC blocking, for reasons to be understood, the frequency at which circuit 21 resonates will be determined primarily by the capacitance of varicap diode 21*a* and the inductance of coils 21*d* and 21*e*. The capacitance presented by diode 21*a*** is determined by the magnitude of an applied DC tuning voltage, developed in a manner to be explained. By varying the voltage amplitude level, that capacitance changes thereby to change the resonant frequency of the tunable circuit.

The resonant frequency is also influenced by the conductive condition of a diode **21*f* which constitutes a switching device connected in shunt with coil 21*d*. Diode 21*f* is controlled by an applied DC switching voltage (the production of which is to be described) which may have either one of two magnitude-polarity conditions—one of which renders diode 21*f* conductive while the other establishes the diode in its OFF condition. The parameters of circuit 21 and the amplitude range over which the tuning voltage is adjusted are selected so that when diode 21*f* is turned OFF varactor diode 21*a* will be capable of tuning circuit 21 across the entire low VHF band, namely from 54 to 88 mHz. Selection of the circuit components and of the extent to which the tuning voltage is varied must also be made so that when switching diode 21*f* is turned ON (thus shorting out coil 21*d*) circuit 21** will be tunable over the entire high VHF band 174–216 mHz.

An adjustable amplitude-tuning voltage may be produced in a variety of different ways. A relatively simple scheme is illustrated to avoid encumbering the drawing. A potentiometer 31 has its two fixed end terminals respectively connected to positive DC voltage sources of different magnitudes in order that the voltage on the potentiometer's movable tap **31*a* may be varied over the amplitude range defined by the two sources. It has been found in a working embodiment of the invention that a tuning voltage adjustable over the amplitude range from +2 volts to +30 volts achieves the desired tuning. Hence, the two end terminals of potentiometer 31 are connected to voltage sources of +2 volts and +30 volts respectively, the negative terminals of those sources being grounded. As will be appreciated, employing a specific amplitude range in the illustrated embodiment simplifies the explanation. Tap 31*a* is connected via a series of four isolating resistors 33 to the varactor diodes of resonant circuits 21–24 in order to apply the tuning voltage on tap 31*a* to each of the varactor diodes. Capacitor 21*c***, and its counterparts, prevent the tuning voltage from reaching the four switching diodes.

As will be explained, a DC band-switching voltage is developed in response to the tuning voltage to effect automatic band switching of tuned circuits 21–24. For reception of any one of channels 2–6 of the low VHF band the magnitude and polarity of the switching voltage will be appropriate to render the switching diodes nonconductive, while tuning to one of the channels 7–13 of the high VHF band results in the switching voltage having an amplitude and polarity to turn ON each of the switching diodes, consequently shorting out coil **21*d* and its three counterparts in circuits 22–24. Adjustment of potentiometer 31 from one to the other of its two extreme positions (namely over the amplitude range from +2 volts to +30 volts) changes the capacitance of each of the varactor diodes to the extent necessary, with the cooperation of the switching diodes, to tune each of circuits 21–23 across both VHF bands and to tune circuit 24** over the appropriate frequency range to produce the required IF output signal.

To tune to each of the 12 channels potentiometer 31 must be effectively adjusted to 12 different distinct positions each of which establishes the tuning voltage at a different amplitude within the amplitude range from +2 to +30 volts. Tuning to each channel thus occurs when the tuning voltage has a discrete amplitude level which is unique and assigned to the channel. The 12 amplitude levels required to effect tuning to he 12 VHF channels are shown by the graph of FIG. 2 which plots the tuning voltage versus the television channels. As indicated, one portion of the tuning voltage range 2–30 volts (specifically from 2 to around 13 volts and labeled "low portion") effects tuning to the low VHF channels 2–6, while the remaining portion of the range (namely from approximately 13 to 30 volts and labeled "high portion") causes tuning to the high VHF channels 7–13. Since the changeover from low-band to high-band tuning occurs at the 13 -volt level, that level is called the "changeover amplitude" in FIG. 2.

In short, the tuning voltage's amplitude is adjustable as between 12 discrete amplitude levels within the predetermined amplitude range (+2 to +30 volts), each level within a first portion (the low portion) of the range being assigned to and effectively designating a different respective channel of the low VHF band and each level within a second portion (the high portion) of the range being assigned to and effectively designating a different respective channel of the high VHF band. The tuning voltage effects tuning to the particular channel designated by the voltage's amplitude level. Since the tuning voltage's amplitude, when adjusted to select a desired channel, is unique to that channel, the selected amplitude level will designate not only the desired channel but also the particular frequency band in which that channel is located.

Of course, potentiometer 31 may be provided with 12 fixed taps along its resistance and with a movable tap that is step-by-step movable to 12 positions to selectively contact the fixed taps, thereby to step the tuning voltage from one to another of the required 12 amplitude levels. An another alternative, the tuning voltage may be produced by a mechanism which is step-by-step actuated or rotated through a series of preset tuner positions. In each position a different presettable potentiometer may be rendered operative. The tuner positions may therefore be pretuned to the active channels in the geographical area where the tuner is employed.

As a still further variation, applicant's tuning voltage developing means may take the form of that disclosed and claimed in copending patent application Ser. No. 803,215, filed Feb. 28, 1969 in the name of George R. Dickinson, and assigned to the present assignee. In that application, an adjustable amplitude-tuning voltage is produced by a light-controlled voltage source having a light-sensitive device, such as a light-dependent resistor, exposed to an adjustable amount of light. In response to different discrete light levels, the tuning voltage assume different amplitude levels.

In accordance with a salient feature of the invention, band switching of tunable means 20 is achieved in response to the tuning voltage. Automatic band switching takes place electronically without the need for any mechanical switches as has been necessary in the past. This is made possible since the tuning voltage's amplitude level, for a desired channel, also designates the frequency band containing that channel. The amplitude level may therefore be utilized to control the band-switching operation. In brief, the switching voltage is produced under control of the tuning voltage's amplitude level and is given one magnitude-polarity condition anytime the amplitude of the tuning voltage is within the low VHF portion of the amplitude range 2–30 volts and is established at another magnitude-polarity condition anytime the tuning voltage's amplitude is within the high VHF portion of that range.

More specifically, this is accomplished in the illustrated embodiment by applying the tuning voltage, via an isolating resistor 39, to the base 41 of an NPN-transistor 42, the collector 43 of which is connected through a resistor 44 to a DC voltage source of positive 24 volts, the source's negative terminal being grounded. The emitter 45 of transistor 42 is connected via a resistor 47 to ground. An NPN-transistor 49 has its emitter 51 connected to the junction of emitter 45 and resistor 47 and its collector 52 connected directly to the source of +24 volts. A voltage divider comprising a pair of resistors 54, 55 is connected between the DC source and ground, the junction 56 of the resistors being connected to the base 57 of transistor 49. The junction of resistor 44 and collector 43 is connected through a current-limiting resistor 60 to the base 58 of a PNP-transistor 59, its emitter 61 being directly connected to the 24-volt source while its collector 62 is connected via a resistor 63 to a DC voltage source of negative 12 volts, the positive terminal of the source being grounded. The junction 64 of collector 62 and resistor 63 (at which junction the DC band-switching voltage is produced) is connected through a series of four isolating resistors 67 to each of the four switching diodes to apply the switching voltage thereto. Capacitor 21*b* and its three counterparts are included to provide DC blocking. The eight capacitors like 21*b* and 21*c* isolate the two DC voltages applied to each of the tuned circuits so that the tuning voltage will control only the varactors and so that the switching voltage will control only the switching diodes.

Transistors 42 and 49 and their associated circuitry constitute a conventional differential amplifier. Since the transition or changeover from one to the other portion of the tuning voltage's amplitude range 2–30 falls at approximately +13 volts, the resistances of resistors 54 and 55 are so selected that a positive voltage of that magnitude will be found at junction 56 and thus applied to base 57. For convenience, that voltage may be referred to as the "changeover voltage." When a low VHF channel is to be selected, the tuning voltage's amplitude will be less than 13 volts. Viewed differently, its amplitude will be negative with respect to that of the changeover voltage. Under those conditions, transistor 49 will conduct while transistor 42 will be cut off and this in turn maintains transistor 59 in its nonconductive condition. As a consequence, the band-switching voltage produced at junction 64 will be established at −12 volts during the reception of any one of channels 2–6 and that magnitude-polarity condition will be suitable to maintain diodes 21*f* and its other three counterparts in their nonconductive conditions, as is necessary in order that varicap 21*a* and its counterparts may tune tunable circuitry 20 to the channels in the low VHF band.

When tuning to a high VHF channel the tuning voltage's amplitude will be greater than, or positive with respect to, the +13-volt changeover voltage. Under those circumstances, transistor 42 will be turned ON while transistor 49 will be cut off. The voltage drop across resistor 44, caused by the collector current of transistor 42, results in forward-biasing transistor 59 to its saturated condition. With transistor 59 fully conductive the band-switching voltage at junction 64 will be established at a +24 volts, and that amplitude-polarity condition will be sufficient to turn ON each of the switching diodes to short out coil 21*d* and its three counterparts thereby to facilitate tuning of circuitry 20 in the high VHF band.

The differential amplifier thus effectively constitutes a bistable device which, in response to the tuning voltage, assumes one operating condition (49 ON and 42 OFF) when the tuning voltage's amplitude is within the low VHF portion of the amplitude range 2–30, and assumes another operating condition (49 OFF and 42 ON) when the amplitude of the tuning voltage is within the high VHF portion. The magnitude-polarity condition of the switching voltage changes, to effect band-switching, each time the operating condition of the bistable device changes. As a result, any time the tuning voltage's amplitude is changed from a level in either one of the portions of the amplitude range to a level in the other portion band switching will occur.

The invention provides, therefore, a novel plural-band varicap tuner in which a tuning voltage controls not only variable capacitance diodes but also an amplitude-responsive band-switching means. Tuning to a desired channel requires that the tuning voltage be established at an amplitude level unique to the channel. The band-switching means effectively senses the amplitude of the tuning voltage to render the tuner tunable over the particular frequency band in which that desired channel is located.

While the invention has been illustrated in connection with a two-band tuner in order to simplify the disclosure, obviously it may easily be applied to a tuner covering three or more frequency bands. For example, in practicing the invention in an all-channel television tuning system well-known circuitry is available to produce, from a tuning voltage having its amplitude range divided into three portions, a switching voltage having three magnitude-polarity conditions each of which effects reception in a respective one of the three television bands, namely the two VHF bands and the UHF band.

While a particular embodiment of the invention has bee shown and described, it is obvious to those skilled in the art that changes and modifications may be made without departing from the invention in its broader aspects, and therefore, it is intended in the appended claims to cover all such modifications and changes as may fall within the true spirit and scope of the invention.

I claim:

1. A tuner for selectively tuning a wave signal receiver to any one of several broadcast channels divided into a plurality of frequency bands, comprising:

means for developing a tuning voltage whose amplitude is adjustable as between several discrete amplitude levels within a predetermined amplitude range, each level within a first portion of said range being assigned to and effectively designating a different respective channel of one of the frequency bands and each level within a second portion of said range being assigned to and effectively designating a different respective channel of another one of the frequency bands;

tunable means, comprising at least one voltage-controlled variable-reactance device included in a tunable resonant circuit having capacitance and inductance, for tuning said receiver;

band-switching means responsive to said tuning voltage for effectively changing the inductance of said resonant circuit when switching from said one to said other band thereby rendering said tunable means tunable over said one band when the voltage amplitude is within said first portion of said range and over said other band when the voltage amplitude is within said second portion; and means for applying said tuning voltage to said tunable means to effect tuning of said receiver to the particular channel designated by the voltage amplitude level.

2. A tuner according to claim 1 in which said tunable means includes a plurality of varactor diodes to achieve tuning to different channels, the capacitances of said diodes varying in response to amplitude variations of said tuning voltage.

3. A tuner according to claim 1 in which said receiver is a television receiver and in which said tunable means, in response to different ones of said amplitude levels, tunes said receiver to different television channels in at least two of the low VHF high VHF and UHF bands.

4. A tuner according to claim 1 in which said tunable means includes a plurality of tunable resonant circuits, each comprising a voltage-controlled variable-capacitance device and an inductance means;

wherein said band-switching means includes a corresponding plurality of switching diodes each of which is coupled to, and shunts a section of, the inductance means of an assigned respective one of said resonant circuits;

in which said band-switching means develops a switching voltage for rendering each of said diodes nonconductive when the amplitude of said tuning voltage is within said first portion of said range and conductive when the tuning voltage's amplitude is within said second portion;

and wherein said tuning voltage is applied to each of said voltage-controlled variable-capacitance devices.

5. A tuner according to claim 1 in which said band-switching means includes at least one switching device and in which band switching of said tunable means is accomplished by applying to said switching device a switching voltage developed by said band-switching means in response to said tuning voltage, said switching voltage having one magnitude-polarity condition any time the amplitude of said tuning voltage is within said first portion of said range and another magnitude-polarity condition any time the tuning voltage's amplitude is within said second portion of said range.

6. A tuner according to claim 5 in which said band-switching means includes a bistable device which, in response to said tuning voltage, assumes one operating condition when the tuning voltage's amplitude is within said first portion of said range and assumes another operating condition when the amplitude of said tuning voltage is within said second portion.

7. A tuner according to claim 5 in which said first and second portions of said range are adjacent, said tuning voltage having a given amplitude at the transition from one portion to the other;

and in which said band-switching means includes a differential amplifier to which is applied said tuning voltage and a changeover voltage having said given amplitude, said amplifier having one condition when the tuning voltage's amplitude is negative with respect to said given amplitude and another operating condition when the tuning voltage's amplitude is positive relative to said given amplitude.

* * * * *